United States Patent [19]

Baldwin et al.

[11] 4,141,027
[45] Feb. 20, 1979

[54] IGFET INTEGRATED CIRCUIT MEMORY CELL

[75] Inventors: Steven M. Baldwin, San Diego; Donald L. Henderson, Sr., Encinitas; Joel A. Karp, Palo Alto, all of Calif.

[73] Assignee: Burroughs Corporation, Detroit, Mich.

[21] Appl. No.: 907,725

[22] Filed: May 19, 1978

Related U.S. Application Data

[63] Continuation of Ser. No. 703,524, Jul. 8, 1976, abandoned.

[51] Int. Cl.$^2$ ................ H01L 27/04; H01L 29/78
[52] U.S. Cl. .................................. 357/51; 307/238;
357/14; 357/23; 357/41; 365/186
[58] Field of Search ................ 357/51, 14, 23, 41,
357/24; 365/182, 186; 307/238

[56] References Cited

U.S. PATENT DOCUMENTS

| | | | |
|---|---|---|---|
| 3,387,286 | 6/1968 | Dennard | 357/41 X |
| 3,740,731 | 6/1973 | Ohwada et al. | 365/186 |
| 3,740,732 | 6/1973 | Frandon | 357/14 X |
| 3,758,831 | 9/1973 | Clark | 357/89 X |

Primary Examiner—Stanley D. Miller, Jr.
Assistant Examiner—James W. Davie
Attorney, Agent, or Firm—Mervyn L. Young; Kevin R. Peterson

[57] ABSTRACT

An IGFET integrated circuit memory cell structure utilizing a capacitor with increased charge storage capability, and a method making the same. The capacitor includes a high impurity concentration region having the same conductivity type as the substrate. An island of opposite conductivity type is inset in the region and a conductive field plate overlies the island. The structure also includes a transfer transistor in which the source region is adjacent the capacitor and overlaps the island region therein. Activation of the transistor serves to transfer the charge stored in the capacitor to the drain region where it can be read by external circuitry. In the method, the high concentration region and island in the capacitor are formed by successive ion implantation steps. A subsequent source and drain diffusion causes lateral migration of the conductive portions of the cell to increase the storage capacitance and to insure electrical contact between the island region of the capacitor and the source of the transfer transistor.

7 Claims, No Drawings

IGFET INTEGRATED CIRCUIT MEMORY CELL

This is a continuation, of application Ser. No. 703,524, filed July 8, 1976, abandoned.

BACKGROUND OF THE INVENTION

This invention relates to semiconductor devices. More particularly, it relates to an IGFET integrated circuit structure for use as a memory cell which includes a capacitor and a transfer device.

Data information storage systems utilizing insulating gate field effect transistor (IGFET) circuits as storage elements have become increasingly popular due to the inherent advantages of the IGFET structure. IGFET circuits have been advantageously utilized in single transistor dynamic memory cells. An example of such memory cells may be had by reference to U.S. Pat. No. 3,740,732 Frandon and U.S. Pat. No. 3,852,800 Ohwada et al. Generally, these and other known memory cells utilize the inherent source capacitance of the transistor to store the charge representing the data. Unfortunately, the charge storage capabilities of these cells are limited which, in turn, limits the performance and density of the cell. Efforts have been made to increase the storage capacitance of these cells, but they have often been at the expense of other device characteristics on the integrated circuit chip or have required additional and/or nonstandard processing steps.

OBJECT AND SUMMARY OF THE INVENTION

Therefore, it is the primary object of this invention to provide an IGFET memory cell with increased storage capacitance which can be made in accordance with the method of this invention that utilizes a minimum of relatively straight forward processing steps.

Briefly, this and other objects of the invention are provided by an integrated circuit structure including a capacitor and a transfer transistor. The capacitor includes a region of high concentration having the same conductivity type as the substrate. The region wholly surrounds an island of opposite conductivity type inset in the substrate surface. A conductive field plate overlies the island region of the capacitor and is insulated from the substrate by a thin insulating layer. A gate region for the transfer transistor similarly overlies portions of the substrate between the source and the drain regions of the transfer transistor. The source region of the transfer transistor is adjacent to the capacitor and overlaps portions of the island of the capacitor. Charge is stored in the capacitor through the transfer transistor. The region of high conductivity provides an increased capacitance for the transistor by decreasing the depletion region of the PN junction developed between the island and the high concentration region. The charge stored in the capacitor can be transferred out through the drain region of the transistor upon applying an appropriate potential to the gate region of the transistor. Consequently, the charge stored in the capacitor can be read out of the drain region of the transistor. In the method of this invention, the high concentration region and island region of the capacitor are formed by successive ion implantation steps. The field plate and gate region are then defined on the substrate surface and are employed as masks for a subsequent source and drain diffusion. During the source and drain diffusion, the island region of the capacitor and the source of the transfer transistor are linked by lateral diffusion of the source impurity. Similarly, the high concentration region of the capacitor laterally diffuses to wholly surround the island region, except for the contact surface, to further enhance the capacitance.

DESCRIPTION OF THE PREFERRED EMBODIMENT

Figure 1:
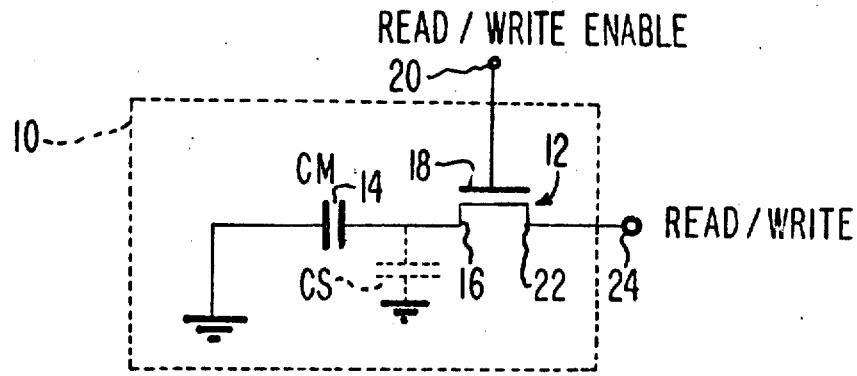
FIG. 1 shows a schematic view of a memory system utilizing the integrated circuit structure of this invention.

Reference to FIG. 1 shows a random access memory system utilizing the integrated circuit structure of this invention. The integrated circuit structure of the present invention is employed as a single transistor memory cell 10 including a transfer transistor 12 and a memory capacitor 14. Transfer transistor 12 includes an inherent source capacitance between the source region 16 and the substrate. This capacitance has been employed in the memory cells of the prior art to provide the charge storing capability for the cell. While this capacitance, labeled as $C_s$ in FIG. 1, is present in the integrated circuit structure of this invention, it is only used in cooperation with the separate memory capacitor 14 which stores the majority of charge for the cell.

Charge is stored in capacitor 14 by applying a turn on voltage to the gate 18 of the transistor 12 via READ/WRITE ENABLE line 20 to form a conductive channel between the source 16 and drain 22. A suitable voltage level, representing a data bit, at READ/WRITE line 24 is thus transferred through transistor 12 to capacitor 14. The voltage on READ/WRITE ENABLE line 20 is then removed to render transistor 12 nonconductive and thereby hold the stored charge in the capacitor 14. When the data, represented by the stored charge in capacitor 14, is desired to be read out, READ/WRITE ENABLE line 20 again supplies a potential to the transistor 12 to turn it on. The charged state of capacitor 14 is then transferred back through transistor 12 where it can be read by a data sense amplifier (not shown) coupled to READ/WRITE line 24. The unique structure and method of making the memory cell 10 provides an increased capacitance for capacitor 14. Consequently, the area required for the active devices can be effectively reduced and performance is increased.

Figure 2:
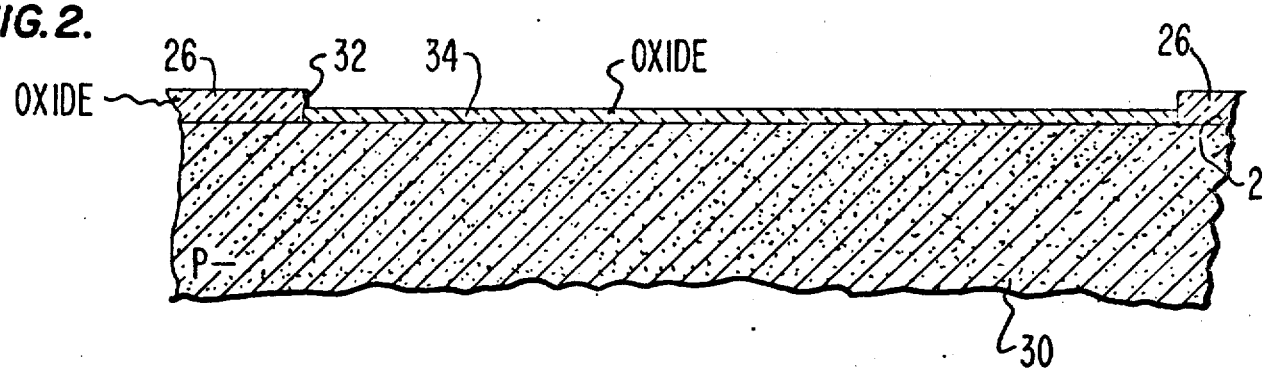
FIGS. 2–8 show successive steps during the method of making the integrated circuit structure in accordance with one embodiment of the method of the present invention.

FIGS. 2 through 8 illustrate the method of making the memory cell 10. Referring now to FIG. 2, a first oxide layer 26 approximately 1 micron thick is grown on the top surface 28 of substrate 30. Substrate 30, preferably silicon, is of a P-type conductivity with a relatively high resistivity and is consequently labeled "P$^-$". Preferably, substrate 30 has an impurity concentration of $10^{14}$–$10^{15}$ impurity atoms per cubic centimeter. The advantage of using a high resistivity substrate is that unwanted parasitic junction capacitances in the devices formed in the substrate are reduced. The oxide layer 26 can be grown or deposited using techniques known in the art. As one example, it can be thermally grown in a steam vapor at 950° C. for a period of 600 minutes under atmospheric pressure. After oxide layer 26 is formed, a window 32 is cut in the oxide layer 26 in the areas where active devices are to be formed. This is accomplished using standard photolithographic techniques whereby a photoresist serves as a mask for a subsequent etching step wherein the oxide is removed in the areas of window 32. The use of photolithography and oxide etching are well known in the art and form no part of this invention. Consequently, they will not be described in detail. After window 32 is cut in oxide layer 26, a second thin oxide layer approximately 0.1 micron thick is grown on substrate surface 28 in the areas defined by window 32. The thin oxide layer 34 will serve as the dielectric for the capacitor and transfer transistor to be formed in substrate 30. Consequently, the thickness of oxide layer 34 can be varied according to desired device parameters. Preferably, however, thin oxide layer 34 is about 0.08–0.12 microns thick.

Figure 3:
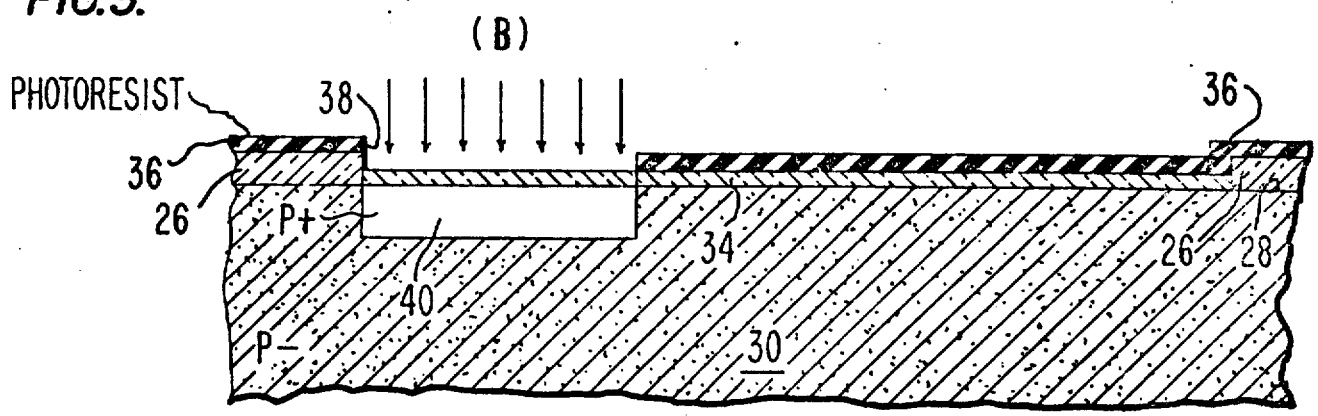

Referring now to FIG. 3, a photoresistor layer 36 is formed on the entire upper surface of the substrate covering oxide layers 26 and 34. The thickness of the photoresist should be sufficient to serve as a mask during the subsequent ion implantation step. Preferably, the thickness of photoresist layer 36 is approximately 0.5 to 2.0 microns thick. Using standard photolithographic techniques, a window 38 is cut into photoresist layer 36 in the areas defining the capacitor. After window 38 is formed, region 40 is formed in substrate surface by ion implantation. Acceptor ions are implanted approximately 1.0–2.0 microns deep into substrate surface 28. In this example, the projected range of the acceptor ions is 1.4 microns deep. The concentration of acceptor ions should be in the range of about $10^{17}$–$10^{18}$ impurity atoms per cubic centimeter. In this example, it has a concentration of about $2.5 \times 10^{17}$ atoms/cm$^3$. A preferred dopant is boron ions, however, other acceptor ions can be used such as aluminum. The region 40 thus formed has an increased impurity concentration compared to that of substrate 30. Consequently, region 40 is labeled as "P+". The P+ region 40 should have an impurity concentration of at least approximately 200 times that of substrate 30. In this preferred embodiment, substrate 30 has an impurity concentration of $10^{15}$ atoms/cm$^3$, while P+ region 40 has an impurity concentration of $2.5 \times 10^{17}$ atoms/cm$^3$. The basic ion implantation steps are well known in the art. In this embodiment, boron ions are accelerated with a potential between 350 and 500 Kev.

Figure 4:
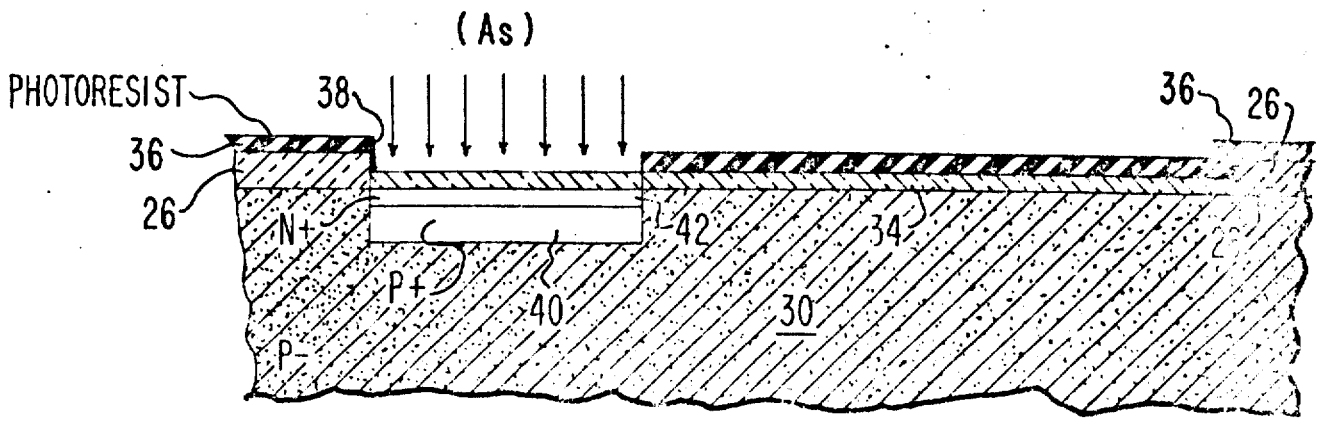

Referring now to FIG. 4, a second ion implantation step is performed to achieve island region 42. It should be noted that no new masks are needed as the original photoresist mask 36 will serve as a mask in this second successive ion implantation step. Island 42 is of an opposite conductivity type than region 40. Region 42 has a preferable impurity concentration of approximately $1 \times 10^{18}$–$5 \times 10^{18}$ impurity atoms per cubic centimeter. A preferred dopant is arsenic ions. However, phosphorous ions can also be used. It is important to note that island 42 does not extend into substrate 30 as deep as region 40. N+ region 42 is preferably approximately 0.01–0.05 microns thick. In this example, it is about 0.03 microns thick. In this example, N+ region 42 was formed by accelerating arsenic ions at a potential of 180 Kev.

Figure 5:
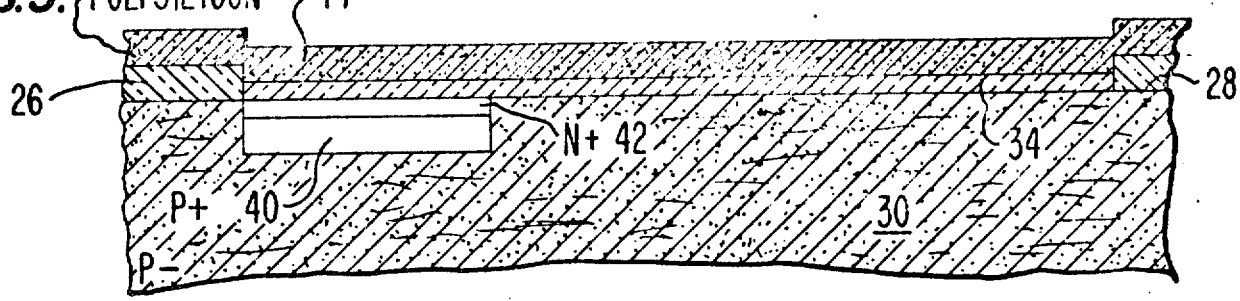

Referring now to FIG. 5, the photoresist layer 36 is removed using a suitable solvent. Then, a polycrystalline-silicon or polysilicon layer 44 is grown on the entire upper surface of the substrate 30 covering oxide layers 26 and 34. The polysilicon layer 44 will serve as the field plate and gate for the capacitor and transfer transistor, respectively. Consequently, the thickness of polysilicon layer 44 must be chosen to serve these purposes. In this example, polysilicon layer 44 is approximately 0.3–0.5 microns thick. Polysilicon layer 44 is formed, in this embodiment, by thermal decomposition of silane at about 900° C. at atmospheric pressure, utilizing a hydrogen carrier gas.

Figure 6:
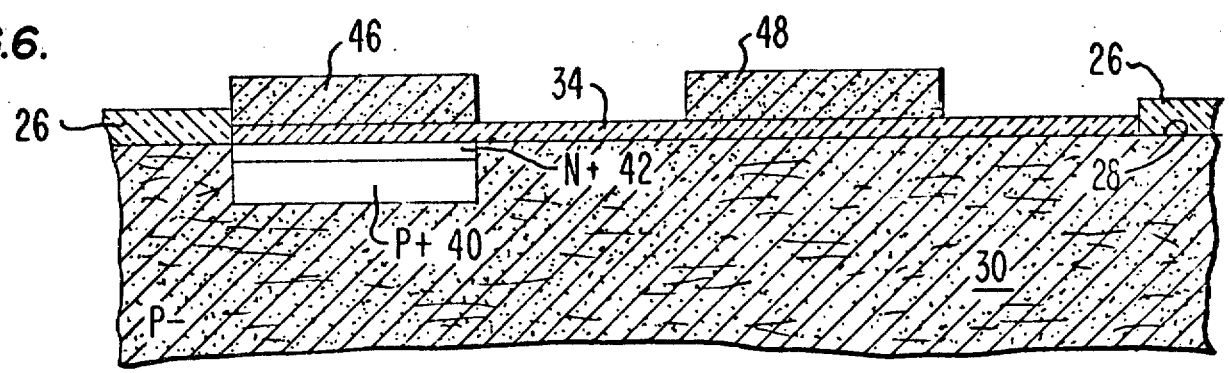

Turning now to FIG. 6, polysilicon layer 44 is defined in the usual manner by a patterned oxide maskant layer (not shown) and a suitable etchant such as potassium hydroxide which will not significantly attack the oxide layers. The polysilicon layer 44 is thus removed in all areas except for those areas defining field plate 46 for the capacitor and gate 48 for the transistor as shown in FIG. 6.

Figure 7:
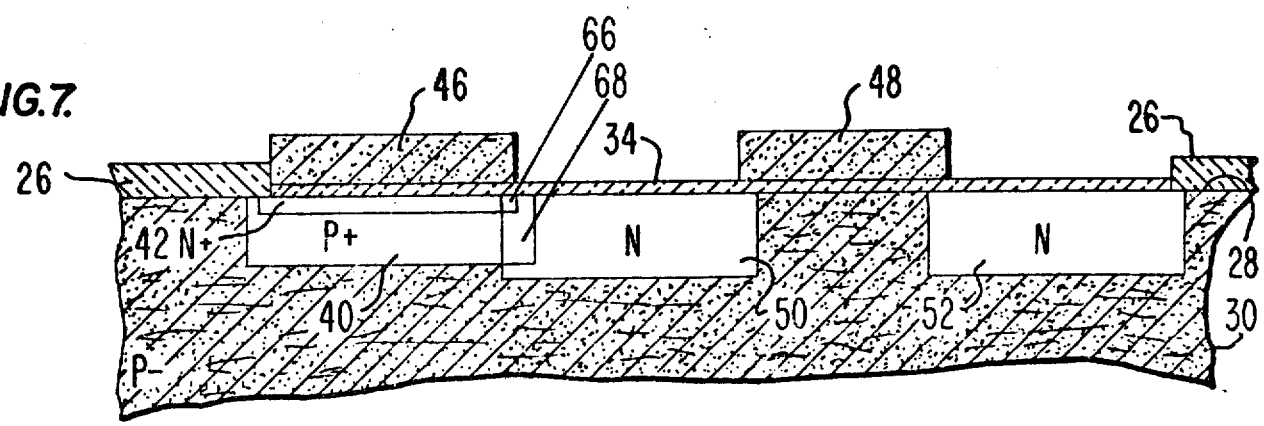

After field plate 46 and gate region 48 are formed, the substrate 30 is subjected to a diffusion to form source region 50 and drain region 52 for the transfer transistor as can be seen in FIG. 7. The substrate is placed in a diffusion furnace containing phosphorous oxychloride gas at a temperature of about 950° C. for a period of 45 minutes under about one atmosphere of pressure. While a preferred dopant is phosphorous, other N-type or donor dopants for source 50 and drain region 52, such as arsenic can be also employed. The source and drain region have an impurity concentration of approximately $10^{19}$–$10^{20}$ atoms/cm$^3$. Field plate 46 and gate 48 are rendered conductive by this diffusion step and consequently serve as electrical conductors.

It is important to note that the source 50 and drain 52 regions diffuse laterally as well as vertically during the heat of this diffusion process. N+ island 42 and P+ region 40 of the capacitor also diffuse laterally during this diffusion process. Consequently, as can be seen in FIG. 7, portions of the source 50 overlap the N+ island 42 to form overlap region 66 which remains an N+ region. This insures that good electrical contact is provided between the island 42 of the capacitor and the source 50 of the transistor. Overlap region 68 is also formed between source 50 and P+ region 40. Since the impurity concentration of the source 50 is much greater than the P+ region 40, the conductivity of the source 50 and overlap region 68 is not greatly affected by the acceptor impurities of the P+ region 40. Another feature of this invention is that the P+ region 40 diffuses laterally to a greater extent than the N+ region 42. Consequently, P+ region 40 wholly surrounds lower portions of N+ region except for the contact with source 50. This is because the diffusion coefficient of the P-type impurities have a higher diffusion coefficient than the N-type impurities in island 42. Consequently, the area of the PN junction formed between N+ island 42 and P+ region 40 is maximized which, in turn, increases the storage capacitance capability of the capacitor. Furthermore, the depletion region of the PN junction is kept to a minimum since the PN junction is formed between two highly concentrated regions, namely, N+ island 42 and P+ region 40. If the island region 42 was formed directly into the high resistivity substrate 30, the PN junction thus formed would have a greater depletion region thereby lowering the capacitance of the capacitor. In contrast, the PN junction depletion region is minimized by this invention to increase the storage capability per unit area of the capacitor.

Figure 8:
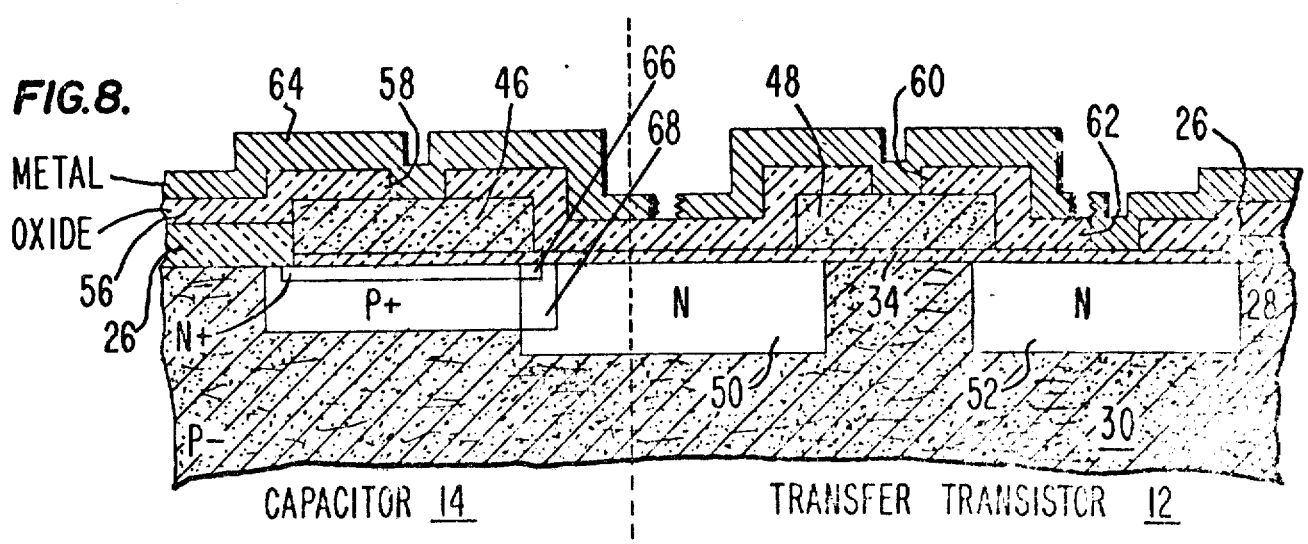

Attention is now drawn to FIG. 8 in which the electrical connections are made to the various devices. An oxide layer 56 is next formed over the upper surface of the substrate 30 as by vapor deposition techniques. The thickness of oxide layer 56 should be such as to provide electrical insulation between the underlying active regions and an overlying metalization layer as is well known in the art. Windows 58, 60, and 62 are etched into oxide layer 56 to expose the field plate 46, gate 48, and drain 52 regions, respectively. A layer of metalization 64 is then deposited over the upper surface of the substrate and makes electrical connection to the field plate 46, gate 48, and drain 52 through their respective openings in oxide layer 56. In this embodiment, an aluminum layer is evaporated onto the substrate. It is then defined by standard photoresist and etching operations to form separate conductors for the field plate 46 for the capacitor 12, as well as the gate 48 and drain 52 of transfer transistor 12. It should be understood, that the connections to the various regions can be varied as desired.

The memory cell shown in FIG. 8 shows one embodiment of the integrated circuit structure of this invention. As denoted by the dotted line, the structure includes a capacitor 14 and a transfer transistor 12. During the operation of this memory cell, as described in connection with FIG. 1, charge will be entered into the capacitor 14 through transfer transistor 12. The charge will be thus stored in capacitor 12 until such time when it will be read through the drain 52 of the transistor 12. The total capacitance of capacitor 14 is the combination of the charge stored between the field plate 46 and the substrate 30 (commonly referred to as the oxide capacitance) and that of the PN junction between island 42 and region 40 (commonly referred to as the depletion region capacitance). The depletion region capacitance is a function of the width of the depletion region of the PN junction. Through the use of the P+ region 42 which has a higher concentration than the substrate 30, the width of the depletion region is minimized to thereby increase the depletion region capacitance. It would be undersirable for the entire substrate 30 to be of such high concentration because the PN junction capacitances of every diffused region in the integrated circuit structure would be increased to such an extent as to render the circuit inoperable.

When the charge in capacitor 14 is to be read, an appropriate potential is applied to the gate 48 of transfer transistor 12. The potential at gate 48 induces a channel between the source 50 and drain 52 region of the transistor. Thus, the charge in capacitor 14 is transferred through transistor 12 and can be read from the drain region 52. The total amount of charge that is read from drain region 52 includes both the capacitance of capacitor 14 as well as the inherent capacitance $C_s$ of source region 50. This inherent capacitance has been utilized by prior art memory cells to store the charge. In contrast, the present invention uses a separate capacitor device in combination with the inherent source capacitance to provide an increased storage capability for the memory cell.

In view of the above description of this invention, it can now be understood that this invention provides an IGFET memory cell having increased storage capabilities which can be made utilizing relatively straight forward individual processing steps which are uniquely combined by the method of this invention to permit the manufacturer to build the device with familiar equipment. Therefore, while this invention has been described in connection with a particular example thereof, no limitation is intended thereby except as defined by the appended claims.

We claim:

1. A semiconductor capacitor comprising:
a substrate having a major surface, said substrate being of one conductivity type with a given impurity concentration;
a first region of opposite conductivity type inset in said substrate surface, said first region having a surface in the plane of said major surface, an opposite surface and side surfaces at least one of which is provided to make electrical contact;
a second region wholly surrounding said first region in said substrate except for said surface in the plane of said major surface and said electrical contact, said second region being of the same conductivity type as said substrate but having a greater impurity concentration than said substrate, said second region and said first region forming a PN junction therebetween;
an insulating layer on said substrate surface, said insulating layer having a portion overlaying said first region, which portion has a thickness less than the thickness of other portions of said insulating layer adjacent the overlaying portion;
a conductive field plate on said portion overlaying said first region to provide capacitance between said first region and said field plate; and
a voltage source coupled to said field plate;
wherein said second region restricts the depletion region of said PN junction formed with said first region thereby increasing the total capacitance of said semiconductor capacitor.

2. The capacitor of claim 1 wherein said substrate and said second region are of a P-type conductivity and said first region is of an N-type conductivity.

3. The capacitor of claim 2 wherein the impurity concentration of said substrate is about $10^{14}$–$10^{15}$ atoms/cm$^3$, the impurity concentration of said second region is $10^{17}$–$10^{18}$ atoms/cm$^3$, and the impurity concentration of said first region is $1 \times 10^{18}$–$5 \times 10^{18}$ atoms/cm$^3$.

4. A semiconductor integrated circuit structure comprising, in combination:
a capacitor including a substrate having a major surface, said substrate being of one conductivity type with a given impurity concentration; a first region of opposite conductivity type inset in said substrate surface, said first region having a surface in the plane of said major surface, an opposite surface and side surfaces at least one of which is provided to make electrical contact; a second region wholly surrounding said first region in said substrate except for said major surface and said electrical contact, said second region being of the same conductivity type as said substrate but having a greater impurity concentration than said substrate, said second region and said first region forming a PN junction therebetween; an insulating layer on said substrate surface, said insulating layer having a portion overlaying said first region, which portion has a thickness less than the thickness of other portions of said insulating layer adjacent to said overlaying portion; a conductive field plate on said portion overlaying said first region to provide a capacitance between said first region and said field plate; and a voltage source coupled to said field plate; and
a field effect transistor for transferring electrical charge into and out of said capacitor, said transfer transistor including source, drain, and gate regions, with said source region being in electrical contact with said first region of said capacitor.

5. The structure of claim 4 wherein said substrate and said second region in said capacitor have a P-type conductivity, with said first region of said capacitor and said source and said drain regions of said transfer transistor being of N-type conductivity.

6. The structure of claim 5 wherein the impurity concentration of said source region of said transfer transistor is greater than that of said second region, thereby insuring good electrical contact between said capacitor and said transfer transistor.

7. The structure of claim 6 wherein the impurity concentration of said substrate is about $10^{14}$–$10^{15}$ atoms/cm$^3$, the impurity concentration of said second region is about $10^{17}$–$10^{18}$ atoms/cm$^3$, the impurity concentration of the first region is about $1 \times 10^{18}$–$5 \times 10^{18}$ atoms/cm$^3$, and the impurity concentration of said source region is about $10^{19}$–$10^{20}$ atoms/cm$^3$.

* * * * *

UNITED STATES PATENT OFFICE
CERTIFICATE OF CORRECTION

Page 1 of 3

Patent No. 4,141,027     Dated February 20, 1979

Inventor(s) Steven M. Baldwin, Donald L. Henderson, Sr. and Joel A. Karp

It is certified that error appears in the above-identified patent and that said Letters Patent are hereby corrected as shown below:

Sheets 1 and 2 of the drawings, Figures 1 through 8, should be included as shown on the attached sheets.

Signed and Sealed this

*Twentieth* Day of *November 1979*

[SEAL]

Attest:

RUTH C. MASON
*Attesting Officer*

LUTRELLE F. PARKER
*Acting Commissioner of Patents and Trademarks*